US006864524B2

(12) United States Patent
Masleid et al.

(10) Patent No.: US 6,864,524 B2
(45) Date of Patent: Mar. 8, 2005

(54) HYBRID BULK/SILICON-ON-INSULATOR MULTIPROCESSORS

(75) Inventors: Robert P. Masleid, Monte Sereno, CA (US); Gregory S. Scott, Santa Clara, CA (US)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/786,276

(22) Filed: Feb. 24, 2004

(65) Prior Publication Data

US 2004/0164334 A1 Aug. 26, 2004

Related U.S. Application Data

(63) Continuation of application No. 09/590,552, filed on Jun. 9, 2000, now abandoned.

(51) Int. Cl.$^7$ .................. H01L 27/108; H01L 29/00
(52) U.S. Cl. .......................... 257/296; 257/499
(58) Field of Search .............. 257/296, 499; 712/32–35

(56) References Cited

U.S. PATENT DOCUMENTS

| | | | | | |
|---|---|---|---|---|---|
| 4,538,247 | A | * | 8/1985 | Venkateswaran | 365/230.06 |
| 5,612,246 | A | * | 3/1997 | Ahn | 438/405 |
| 5,894,152 | A | * | 4/1999 | Jaso et al. | 257/347 |
| 5,895,487 | A | * | 4/1999 | Boyd et al. | 711/122 |
| 5,956,597 | A | * | 9/1999 | Furukawa et al. | 438/405 |
| 6,381,669 | B1 | * | 4/2002 | Chudnovsky et al. | 711/5 |
| 6,397,324 | B1 | * | 5/2002 | Barry et al. | 712/225 |

OTHER PUBLICATIONS

Rudack et al. "Yield Enhancement Considerations for a Single-Chip Multiprocessor System with Embedded DRAM" International Symposium on Defect and Fault Tolerance in VLSI Systems, Nov. 1–3, 1999. IEEE, pp. 31–39.*

Crowder, S. et al. "An Embedded DRAM High Performance 0.18 um Logiv Technology with Copper Beol" 1998 Int'l Electron Devices Meeting. Technical Digest. Dec. 6–9, 1998.*

Bernstein, K. et al. SOI Circuit Design Concepts. Kluwer Acadmic Publishers, 2000. TK7871.99M44B48 2000.*

* cited by examiner

*Primary Examiner*—Craig A. Thompson
(74) *Attorney, Agent, or Firm*—Fenwick & West LLP

(57) ABSTRACT

A multiprocessor integrated circuit is disclosed. A preferred embodiment of a multiprocessor chip has microprocessors formed on silicon-on-insulator regions and dynamic random access memory level-2 cache memories or level-3 cache memories formed on bulk regions of the chip. A preferred embodiment includes a redundant architecture having a signal bus for coupling the microprocessors to the level-2 or level-3 cache memories in which the signal bus includes a programmable selector circuit for bypassing defective microprocessors or defective level-2 or level-3 cache memories.

24 Claims, 8 Drawing Sheets

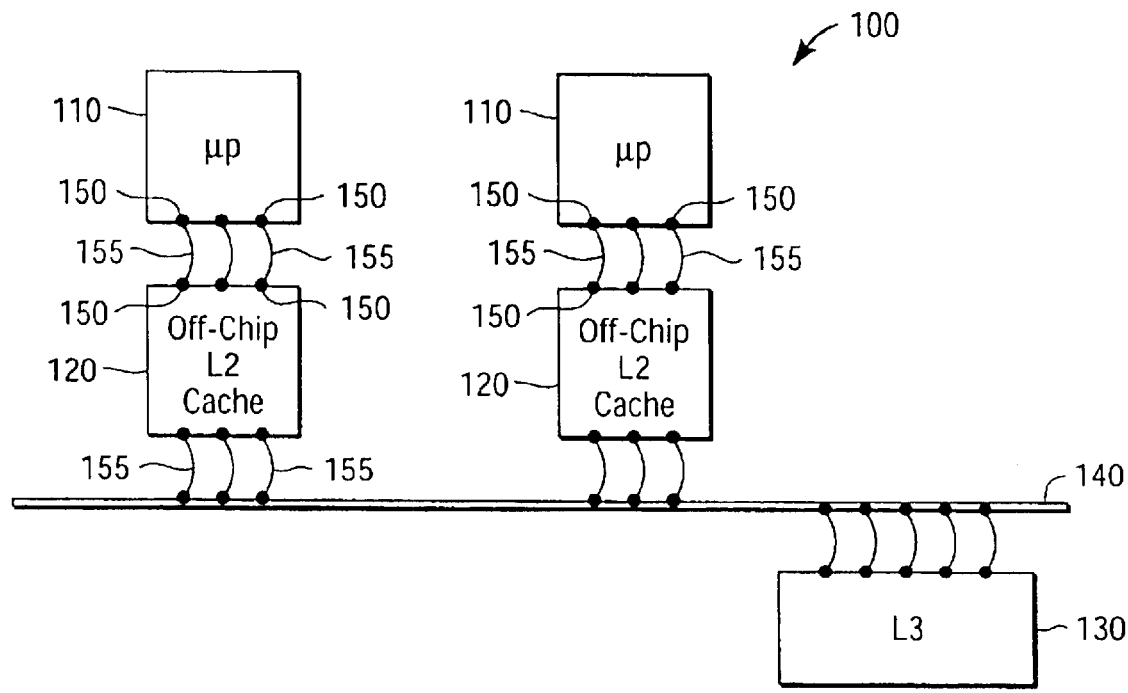
FIG. 1 (PRIOR ART)
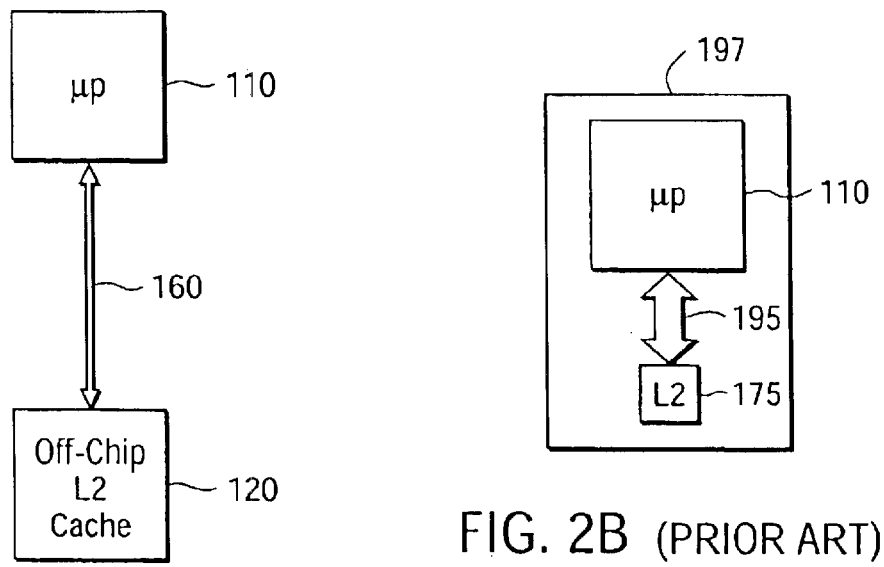
FIG. 2A (PRIOR ART)
FIG. 2B (PRIOR ART)

HYBRID BULK/SILICON-ON-INSULATOR MULTIPROCESSORS

RELATED APPLICATIONS

This application claims priority to and is a continuation of U.S. patent application Ser. No. 09/590,552, entitled "Hybrid Bulk/SOI Multiprocessors," filed on Jun. 9, 2000, now abandoned, by Robert P. Masleid, et al.

BACKGROUND OF THE INVENTION

1. Field of the Invention

The present invention relates generally to multiprocessors, redundant circuits, and high-speed microprocessors. More particularly, the present invention is directed towards a multiprocessor chip with a redundant architecture having microprocessors fabricated on silicon-on-insulator and dynamic random access memory elements fabricated on bulk silicon.

2. Description of Background Art

Multiprocessing is the use of more than one microprocessor to perform parallel processing. An apparatus to perform multiprocessing is typically called a multiprocessor or a parallel processor. There are several common control topologies for coordinating the action of the microprocessors and coupling the multiprocessor to a network. The microprocessors typically reside on separate chips with the system of microprocessors and memory units residing on one or more printed circuit boards. A signal bus is used to couple the microprocessors to different levels of memory.

One common application of multiprocessing is transaction processing, such as a banking or financial transaction, in which it is desirable to process an entire transaction in parallel. A transaction processor preferably has a large number of high-speed microprocessors coupled to a network by high bandwidth signal buses.

Each microprocessor of a multiprocessor system typically has a multiple level memory hierarchy that includes a small, fast cache memory close to the microprocessor and a larger slower main memory farther away from the microprocessor. The cache memory is typically a random access memory (RAM) that the microprocessor can access more rapidly than regular memory. Each microprocessor looks first to its corresponding cache memory to find data and instructions. The cache memory has levels of closeness, size, and accessibility to the microprocessor. Each level of cache memory typically has more memory than its predecessor but at the cost of a longer access time. Level-1 (L1) cache memory resides on the same chip as its corresponding microprocessor and may have a size of about 32 kilobytes or more. In modern microprocessors, level-2 (L2) cache memory typically resides off chip, although some microprocessor chips include a L2 cache memory implemented as low capacity static random access memory (SRAM). Typically the L2 cache memory is implemented as an SRAM or as a dynamic random access memory (DRAM) located on a different chip than the microprocessor. A popular off-chip L2 cache memory size is a 1 megabyte L2 cache. The level-3 (L3) cache memory always resides off-chip, and is often implemented as DRAM with a size of between about 4 megabytes to 32 megabytes. Each cache memory is often divided into separate data and instruction caches.

FIG. 1 is an illustrative block diagram of a conventional multiprocessor system 100 that includes a plurality of microprocessor chips 110. Each microprocessor chip 110 has its own L2 cache memory chip 120 and is coupled to other memory elements (e.g., a L3 cache memory chip 130) via a network signal bus 140. Conventional chip edge-pin I/O connections 150 and wires 155 are used to couple each microprocessor chip 110 to its corresponding L2 cache memory chip 120.

The speed of individual microprocessors continues to improve, with some silicon microprocessors having clock rates of about one GHz. However, the system performance of conventional multiprocessors is not keeping up with the improvements in microprocessor performance. This is because as the speed of each microprocessor increases the performance of the multiprocessor system tends to be increasingly determined by the rate at which data can be transferred between each microprocessor and its memory. This is commonly known as the memory bandwidth bottleneck. Memory bandwidth is defined as the data carrying capacity in bits per second. Memory bandwidth for random access memory (RAM) is a function of the rated speed of the RAM and the size of the data path to and from the RAM. In some multiprocessor systems, particularly systems having a large L2 cache and a microprocessor clock rate approaching one GHz, it can take ten-to-twenty clock cycles or more for data and instructions to be accessed from the off-chip L2 cache.

The memory bandwidth of a microprocessor having off-chip L2 cache memory is limited because conventional edge-pin I/O connections 150 and wires 155 have a limited ability to couple data between each microprocessor chip 110 and its associated L2 cache memory chip 120. At a clock frequency approaching one GHz a single wire 155 may be modeled as a lossy transmission line having a significant resistance and capacitance. A single data pulse (bit) transmitted along a wire 155 will have a significant propagation delay (transit time) associated with the path length of wire 155. There is also a rise-time associated with the impedance of the wire lead 155 and the parasitic impedances of the edge-pin I/O connections. There is thus a significant inter-chip time delay to transmit data between each microprocessor chip 110 and its L2 cache memory via a wire 155. There is also a maximum data rate (bandwidth) of each wire 155 in terms of the number of bits per second of data that it can transmit between microprocessor chip 110 and L2 cache memory chip 120. There are also a limited number of wires 155 that can be coupled to the edge pin I/O connections 150. The combination of all of these effects limits the rate at which data words from an off-chip L2 cache memory may be communicated to a microprocessor and also results in a large latency (time delay) for communicating data words.

As shown in FIG. 2A, a multiprocessor system 100 with off-chip L2 cache memory can be modeled as having each microprocessor 110 coupled to off-chip L2 cache memory 120 by a low bandwidth connection 160. Latency (transit time) of the connection is represented by the length of the arrow. The width of the arrow corresponds to the number of signals that it is capable of communicating. The small bandwidth of connection 160 is illustrated in FIG. 2A by the narrowness and length of the arrow 160. As shown in FIG. 2B, an on-chip L2 cache memory 175 disposed on the same chip 197 as the microprocessor 110 increases the bandwidth of the signal path, as indicated by the width and short length of arrow 195. However, conventional on-chip SRAM memory has a low density such that the total data size of the SRAM memory is comparatively small, as indicated by the small area of on-chip cache memory 175 in FIG. 2B. This is also undesirable, because a smaller L2 cache memory decreases system performance by increasing the frequency with which each microprocessor must access data and instructions from off-chip L3 cache memory.

Unfortunately, it is impractical with previously known techniques to integrate all of the microprocessors 110 and large capacity L2 cache memories 120 of a multiprocessor onto a single chip with acceptable yield, productivity (number of chips per wafer), and process compatibility. One factor that limits productivity is related to the size of the component units. Each microprocessor consumes a significant area, as do the caches. The process steps for fabricating static random access memory (SRAM) L2 cache memories are compatible with the process steps used to fabricate high speed microprocessors but SRAM L2 caches have a limited memory capacity because of the low data density of SRAM. It is thus impractical to include several conventional microprocessors and several large data capacity SRAM cache memories within a conventional die size. DRAM memory is typically ten times denser than SRAM, but commercial DRAM processes use fabrication steps that are often incompatible with the process steps used to fabricate high-speed microprocessors. For example, some of the process steps commonly used to fabricate dense L2 DRAM memory would degrade the speed of the microprocessors. In particular, the increased thermal budget from the added process steps required to fabricate the DRAM memory can degrade the transistors of the microprocessor. Also, some of the processing steps used to fabricate high performance microprocessors are incompatible with commercial DRAM processes. For example, DRAM cannot be fabricated on a silicon-on-insulator structure because of excessive leakage currents in the DRAM. The leakage currents lead to an unacceptable refresh rate for the DRAM. Another consideration is chip yield, since a low chip yield may render a process uneconomical. Integrating all of the microprocessors and L2 cache memories of a multiprocessor onto one chip increases the total number of components, which tends to decrease chip yield according to well known laws of probability.

Until recently the approach of designing a multiprocessor to have separate microprocessor chips and separate large data capacity L2 cache memory chips has been successful because silicon-based microprocessors had clock rates that were comparatively low (e.g., a fraction of one GHz) and because semiconductor packaging engineers were able to make significant improvements in the bandwidth of inter-chip connections. However, the inter-chip signal bandwidth afforded by conventional packaging techniques has many physical limits and is not expected to increase at the same rate as microprocessor speed. The memory bandwidth limitations of multiprocessors having off-chip L2 cache memory is thus expected to become an increasingly severe bottleneck to achieving further improvements in the processing speed of multiprocessors, particularly transaction processors.

Therefore, there is a need for an improved method and architecture for forming a multiprocessor chip having high-speed microprocessors and dense L2 cache memories integrated on a single chip.

SUMMARY OF THE INVENTION

Broadly speaking the present invention generally includes: a) an apparatus and method for fabricating an integrated circuit chip having silicon-on-insulator (SOI) microprocessors and dynamic random access memory (DRAM) cache memories integrated onto a single chip; and b) a redundant architecture for improving the yield of a chip having microprocessors and on-chip cache memory, particularly a multiprocessor chip having SOI microprocessors and DRAM cache memories.

In accordance with an embodiment of the present invention, there is provided an integrated circuit chip having a plurality of microprocessors and a plurality of cache memories linked by a signal bus. The signal bus includes a programmable selector circuit for forming a signal link between each selected microprocessor and a level-2 cache memory.

In accordance with an embodiment of the present invention of a multiprocessor chip, the microprocessors are fabricated on SOI regions having a buried oxide layer whereas the cache memories are fabricated on bulk silicon regions of the substrate. A preferred process for fabricating the SOI regions includes masked oxygen ion implantation and annealing to form the buried oxide layer in SOI regions with cache memories fabricated as trench DRAMs having process steps arranged to reduce deleterious diffusion in microprocessor regions. The cache memories are preferably sized to provide the L2 cache memory requirements of the chip. In one embodiment, the cache memories are sized to provide the L2 and L3 cache memory requirements of the chip. Each microprocessor and the cache memories are preferably linked by a programmable signal bus. In a preferred embodiment, the multiprocessor chip includes at least one redundant microprocessor. In an alternate embodiment, all of the major large area components, such as the microprocessors and L2 cache memories, have at least one redundant element. The programmable signal bus permits defective components, such as a defective microprocessor or a defective cache memory, to be disabled and ignored.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

FIG. 1 is a circuit diagram of a prior art multiprocessor.

FIGS. 2A and 2B are illustrative diagrams of some of the memory bandwidth drawbacks of prior art multiprocessors.

DETAILED DESCRIPTION OF THE PREFERRED EMBODIMENTS

The figures depict a preferred embodiment of the present invention for purposes of illustration only. One of skill in the art will readily recognize from the following discussion that alternative embodiments of the structures and methods disclosed herein may be employed without departing from the principles of the claimed invention.

Figure 3A:
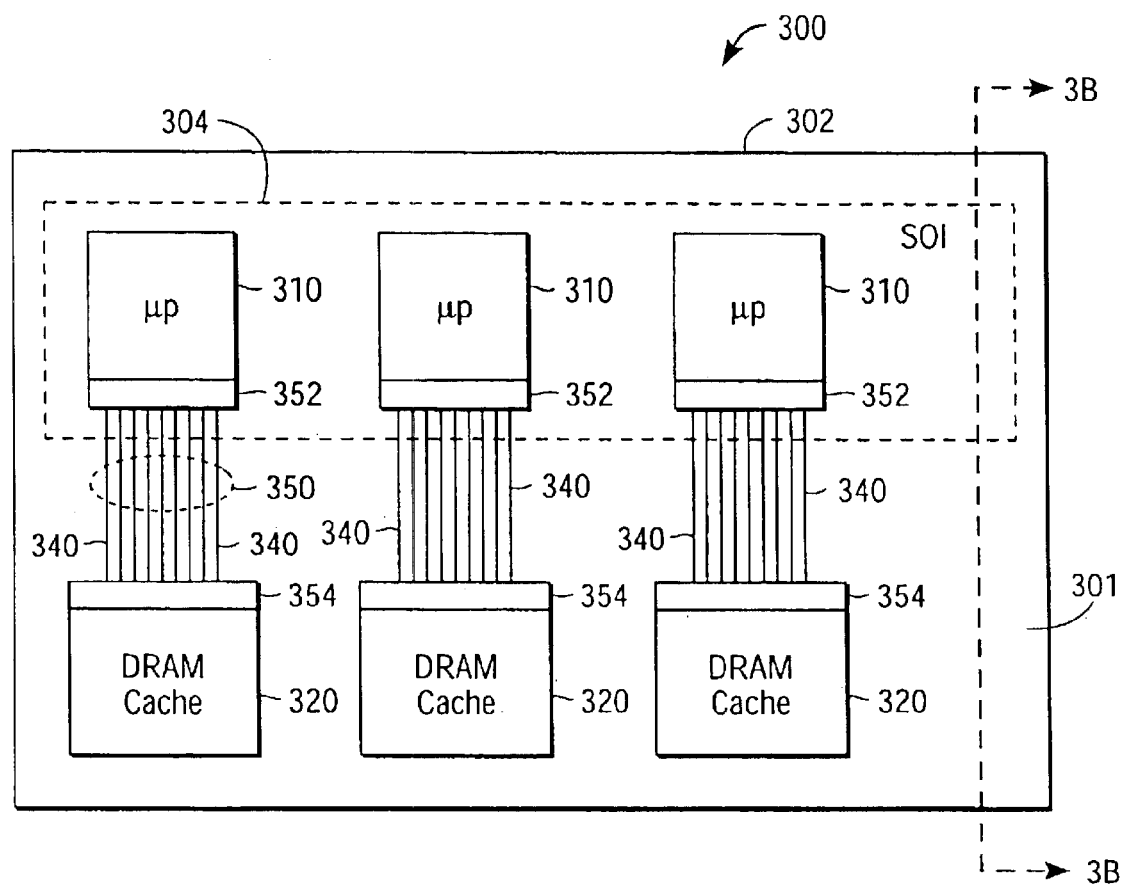
FIG. 3A is a circuit diagram of one embodiment of a multiprocessor in accordance with the present invention.
Figure 3B:
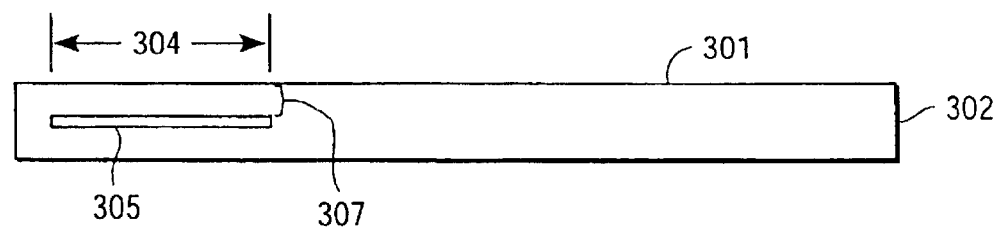
FIG. 3B is an illustrative side view of a portion of the multiprocessor of FIG. 3A along the line 3B—3B.

FIG. 3A is a block diagram illustrating a first embodiment of a chip 300 of the present invention. Chip 300 is an integrated circuit that is preferably formed on a conventional semiconductor substrate die size. Some details are omitted for the purposes of illustration. The inventors of the present application have recognized that recent advances in ultraviolet lithography, optical pattern correction, and phase-shift masking permit a greater than four-fold reduction in the size of high-speed microprocessors compared with microprocessors fabricated by conventional optical lithography. Consequently, as shown in FIG. 3A, chip 300 includes a plurality of microprocessors 310 within a conventional die size, such as a die size of 400 square millimeters. Each microprocessor 310 includes a central processing unit, a conventional level-1 cache memory, and other conventional microprocessor circuitry. In the preferred embodiment, chip 300 is a multiprocessor chip having microprocessors 310 coupled to work together as a parallel processor. Multiprocessor chip 300 may include any conventional logic and control circuitry (not shown in FIG. 3) and pin input/output connections (not shown in FIG. 3) to couple signals to and from the microprocessors 310 to a network interface (not shown in FIG. 3) and to couple each microprocessor to a conventional off-chip main memory (not shown in FIG. 3). As described below in more detail, in a preferred embodiment ultraviolet lithography permits nine or more microprocessors 310 to be included in a multiprocessor chip 300 having a conventional die size of 400 square millimeters with additional room available for on-chip large capacity L2 DRAM cache memories.

As shown in FIG. 3A, in a preferred embodiment each microprocessor 310 is fabricated on a buried insulator region 304 of substrate 302. For the purposes of illustration, all of the microprocessors 310 are shown as residing on a single buried insulator region 304, although it will be understood that the microprocessors 310 may be distributed across the surface of chip 300 with each microprocessor formed on one of the buried insulator regions 304. As shown in the side view of FIG. 3B, buried insulator region 304 has a buried insulator layer 305 residing a short distance underneath the upper surface 301 of substrate 302. Buried insulator layer 305 separates the bulk substrate 302 from a crystalline surface region 307. Conventional semiconductor fabrication techniques may be used to form a microprocessor on region 307.

In the preferred embodiment and as described hereinafter, substrate 302 is a silicon substrate and buried insulator region 304 includes a buried insulator layer 305 that is a buried oxide forming what is commonly known as a silicon-on-insulator (SOI) structure. The buried insulating layer 305 of a SOI structure reduces the junction capacitance of the transistors fabricated on it. The buried insulating layer 305 also provides other benefits such as lower power consumption, improved high frequency characteristics, and reduced substrate current conduction compared with microprocessors fabricated on bulk silicon. SOI microprocessors consume significantly less power than microprocessors fabricated on bulk silicon. The low power consumption of SOI microprocessors is one factor that permits a large number of active microprocessors (e.g., eight) to be integrated onto a single chip 300. SOI microprocessors also operate at clock cycles up to 20–35% faster than microprocessors fabricated on bulk silicon.

In a preferred embodiment, each cache memory 320 of multiprocessor chip 300 is implemented as dynamic random access memory (DRAM) fabricated in bulk regions of the silicon substrate 302, i.e., formed in regions that do not have a buried insulating layer 305. This is because it is impractical to fabricate high performance DRAM in SOI regions because of the high leakage current. DRAM circuits are about a factor of 7–10 more compact than SRAM circuits having the same data storage capacity. In one preferred embodiment, the cache memories 320 have a data capacity sufficient to provide the function of level-2 (L2) cache memories. However, as described below in more detail, dense DRAM technology permits each cache memory 320 to have a substantial memory capacity such that a cache memory 320 may also be used to provide the memory function traditionally provided by an off-chip level-3 (L3) cache memory.

Each cache memory 320 is coupled to a corresponding microprocessor 310 by a plurality of interconnect wires 340 fabricated on the substrate. Each individual interconnect wire transmits a single bit, with groups of interconnect wires being arranged in buses to transmit multiple bytes of data simultaneously. Interconnect wires 340 are part of a high bandwidth signal bus 350 for coupling data signals between each microprocessor 310 and its cache memory 320. Microprocessor 310 may have any conventional data interface 352 for receiving signals from interconnect wires 340, such as a conventional data port. Similarly, cache memory 320 may have any conventional memory interface 354 for accessing data in cache memory 320, such as conventional memory port. The interconnect wires 340 are preferably fabricated as high conductance interconnect wires, such as copper interconnect wires. The interconnect wires are also preferably separated from the substrate and other conductive portions of the substrate by an insulator having a low dielectric constant (e.g., a relative permittivity of about 2.5) and a thickness selected to be as large as practical in order to reduce the parasitic capacitance of the interconnects.

The interconnect wires 340 may be configured in any known bit line configuration. In the present invention there can be a large linear density (number per millimeter) of interconnect wires 340 coupling each microprocessor 310 to its corresponding on-chip cache memory 320 because interconnect wires 340 are fabricated on the substrate using conventional semiconductor fabrication techniques. Semiconductor processing presently permits about 4000–9000 wires per millimeter. For a chip having a die size of 20 millimeters×20 millimeters, this corresponds to up to 80,000–180,000 potential interconnect signal paths, each signal path having a signal bandwidth of about 1.0 to 3 GHz. The large number of potential high bandwidth interconnect wires allows each microprocessor 310 to be connected to a corresponding cache memory 320 by a large number of lines (i.e., communicating data and instructions in the form of wide words via a large number of interconnect wires). Moreover, as described above, each interconnect wire may be designed to be a high bandwidth interconnect (e.g., a bandwidth of 1.0–3.0 GHz) because of its high conductance, low capacitance, and low parasitic inductance.

Figure 4:
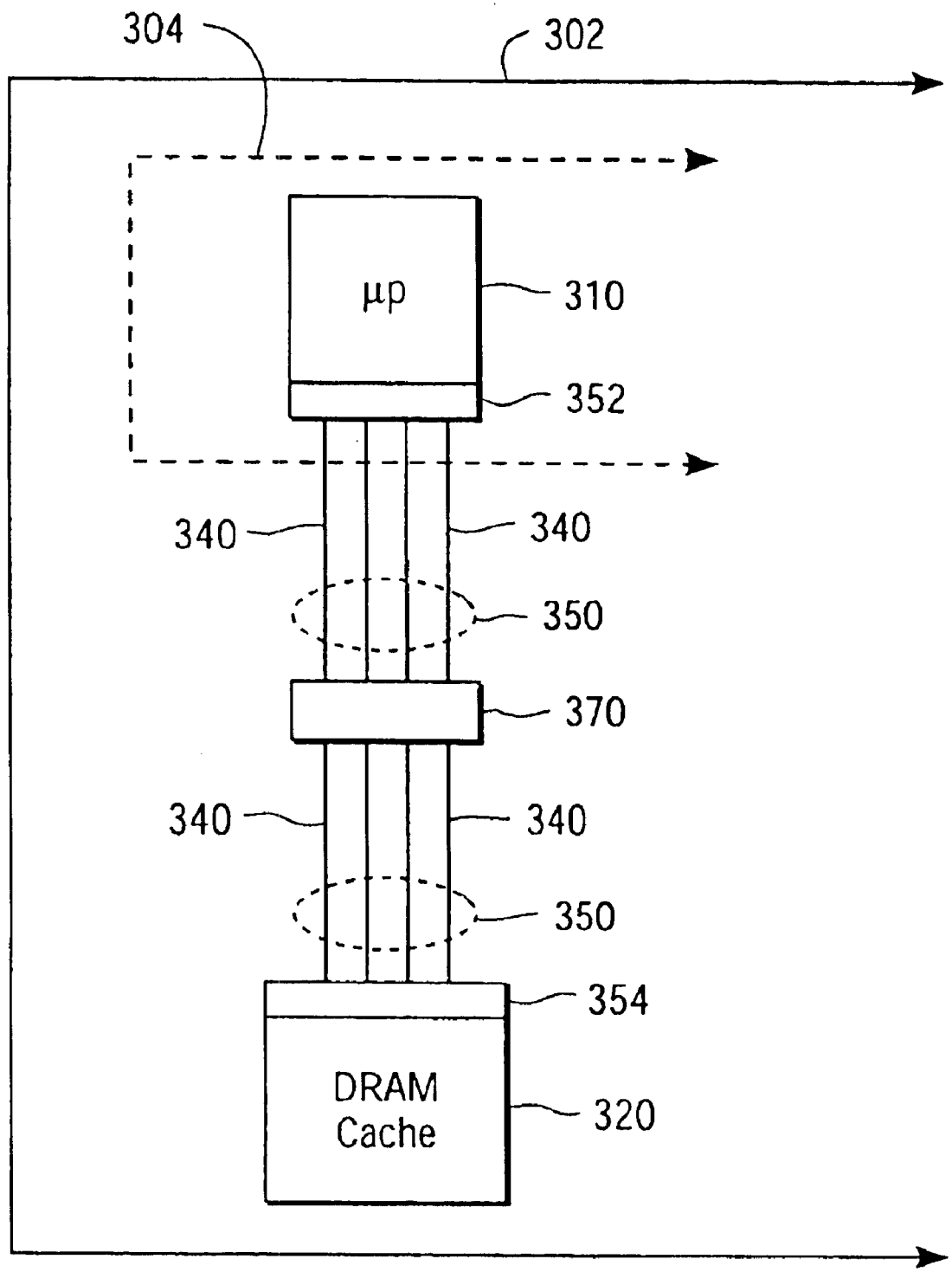
FIG. 4 is a block diagram showing a detailed portion of a signal bus of FIG. 3A having active signal regeneration elements.

As shown in FIG. 4, each interconnect preferably includes active elements 370 (e.g., active elements arranged in stages) to reduce the degradation of data signals propagating through the signal buses 350. Examples of active elements 370 include buffers, repeater-buffers, or pipeline latches arranged to regenerate data signals. It will be understood that active elements 370 may be included anywhere in the signal bus, including within a data interface 352 or a memory interface 354. A signal bus with an active element 370 to regenerate data signals improves the effective bandwidth of the signal bus. The memory bandwidth of the present invention is estimated to be capable of twice the frequency and forty times the signal count of a conventional multiprocessor 100 with off chip L2 cache memories 120. Conventional chip-to-chip packaging techniques typically allow only about 2000 to 4000 potential total off-chip wires and the signal bandwidth of each off-chip wire is typically limited to a range of between about 0.5 to 1.5 GHz per wire. Thus, the memory bandwidth of the present invention is expected to be at least a factor of 80 greater compared to a multiprocessor 100 with conventional off-chip L2 cache memory.

The system performance of multiprocessor chip 300 is also improved in the present invention by utilizing a dense DRAM architecture that has compact memory cells. Fabricating cache memories 320 as DRAM in bulk regions of multiprocessor chip 300 has the advantage that large data capacity L2 cache memories may be included in a multiprocessor chip 300 having a conventional die size. Moreover, in a preferred embodiment of the present invention the data capacity of on-chip cache memories 320 is selected to be sufficiently large such that it eliminates the need for an off-chip L3 cache memory, i.e., each cache memory 320 has sufficient capacity to provide data and instructions which would traditionally be supplied by separate L2 and L3 caches. For example, with an embedded DRAM cell size of 0.1 square microns a multiprocessor 300 of the present invention can contain 1 Gb (128 MB) of total DRAM capacity within 200 square millimeters of chip area. Consequently, for a multiprocessor chip 300 having a die size of about 400 square millimeters (with about half the die devoted to cache memory) all of the L2 and L3 cache memory requirements of the multiprocessor can be satisfied by the on-chip cache resources of on-chip L2 cache memories 320. It will also be understood that the L3 cache memory may be implemented as an additional on-chip cache, i.e., multiprocessor chip 300 may have each microprocessor 310 coupled by signal buses 350 to an on-chip cache memory 320 serving as an L3 cache.

Providing on-chip L2 and L3 cache resources in multiprocessor chip 300 provides many system advantages compared to a conventional multiprocessor 100 with off chip L2 cache memory 120 and off chip L3 cache memory 130. In particular, in the present invention, a multiprocessor chip 300 with high bandwidth signal buses 350 and on-chip cache memories 320 sized to provide the cache resources of both L2 and L3 cache memories is expected to provide a substantial improvement in the performance of multiprocessor chip 300 because of the comparatively few number of clock cycles required to transfer data from an on chip cache memory 320 to an on-chip microprocessor 310 via a high bandwidth on-chip signal bus 350.

A multiprocessor chip 300 incorporating a large number of microprocessors 310 and cache memories 320 requires a comparatively large die size and utilizes more process steps than a conventional microprocessor. The processing cost per die is thus expected to be more than for a conventional high-performance microprocessor chip. An economical manufacturing process thus requires a reasonable yield in order to achieve an acceptable cost per usable chip. One drawback to integrating all of the microprocessors 310 and cache memories 320 onto a single chip is that there is a high probability that at least one of the components will have a serious defect that renders the entire multiprocessor chip unusable. Consequently, a preferred embodiment of the present invention utilizes a redundant architecture to improve the chip yield.

Figure 5A:
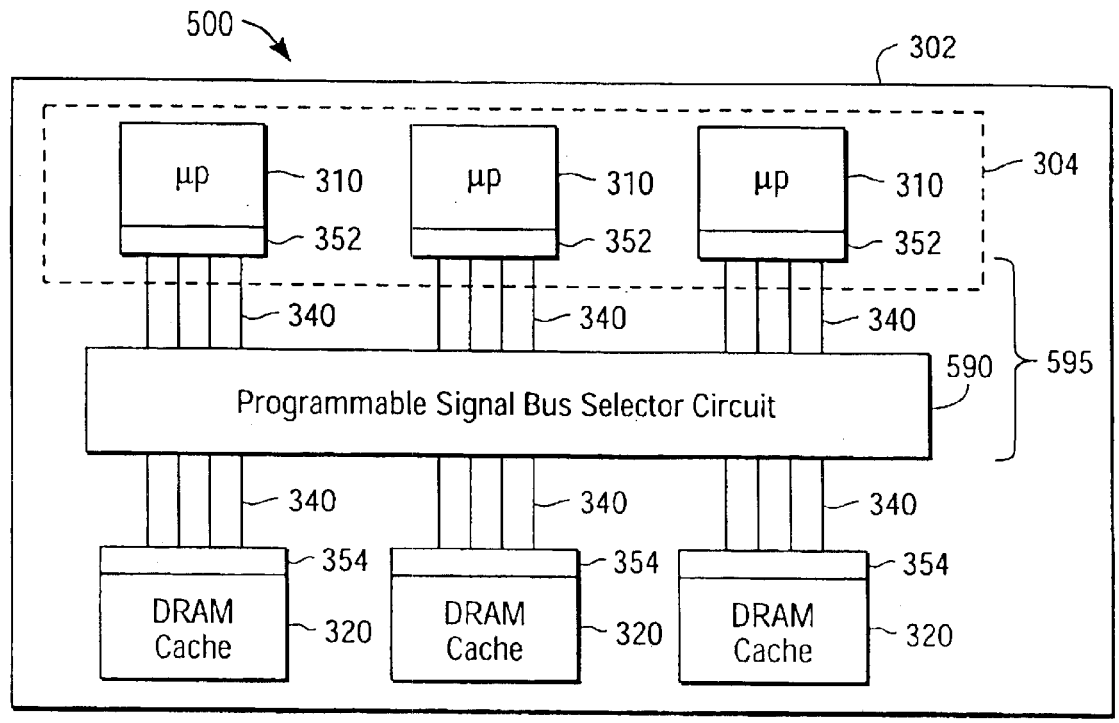
FIG. 5A is a circuit diagram of an embodiment of a multiprocessor having redundant components in accordance with the present invention.
Figure 5B:
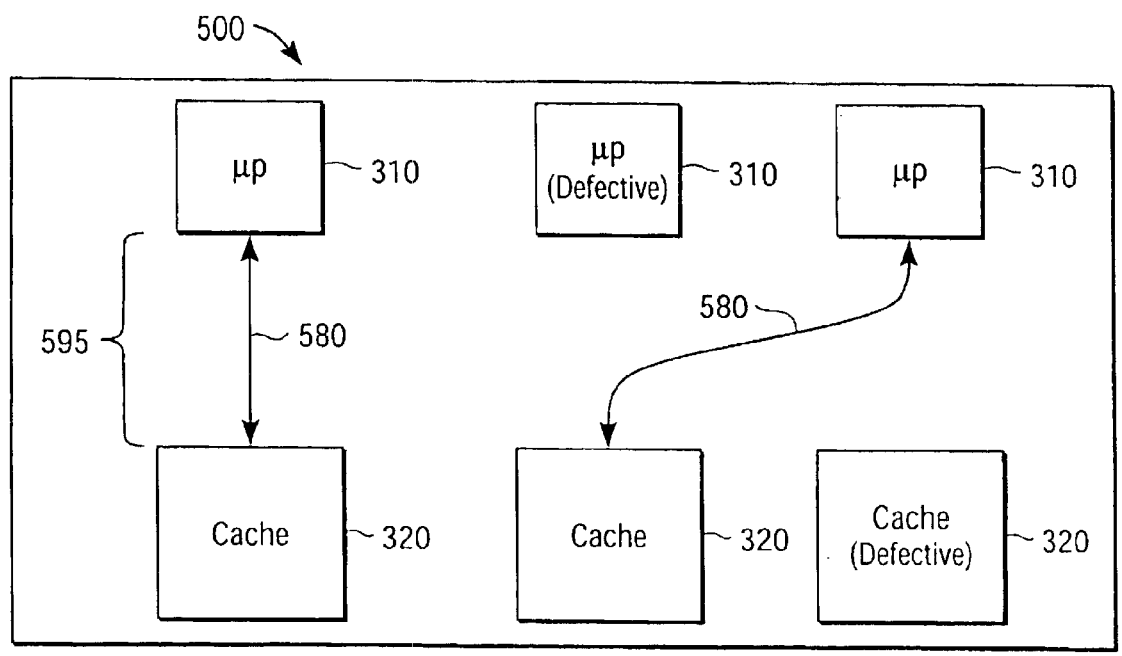
FIG. 5B is a diagram illustrating how the circuit of FIG. 5A may be used to route around defective components.

FIG. 5A shows a first embodiment of a multiprocessor 500 having redundant components coupled by a programmable signal bus 595 having a programmable selector circuit 590. At least one extra (redundant) microprocessor 310 is included. An extra (redundant) cache memory 320 is preferably also included. Thus, in a multiprocessor having a total of N fabricated microprocessors 310, the programmable selector circuit 590 of the signal bus 595 selects a subset of the microprocessors, such as N−1 microprocessors as the active microprocessors, where N is an integer. Similarly, if there are N fabricated cache memories, the signal bus selects a subset of the cache memories, such as N−1 cache memories as the active cache memories. As shown in FIG. 5B, programmable signal bus 595 permits the links 580 between microprocessors and the cache memories to be selected to route around defective components. In a preferred implementation, programmable signal bus 595 utilizes a multiplexor circuit having a plurality of multiplexors arranged to select appropriate links between the microprocessors and the cache memories.

Figure 6:
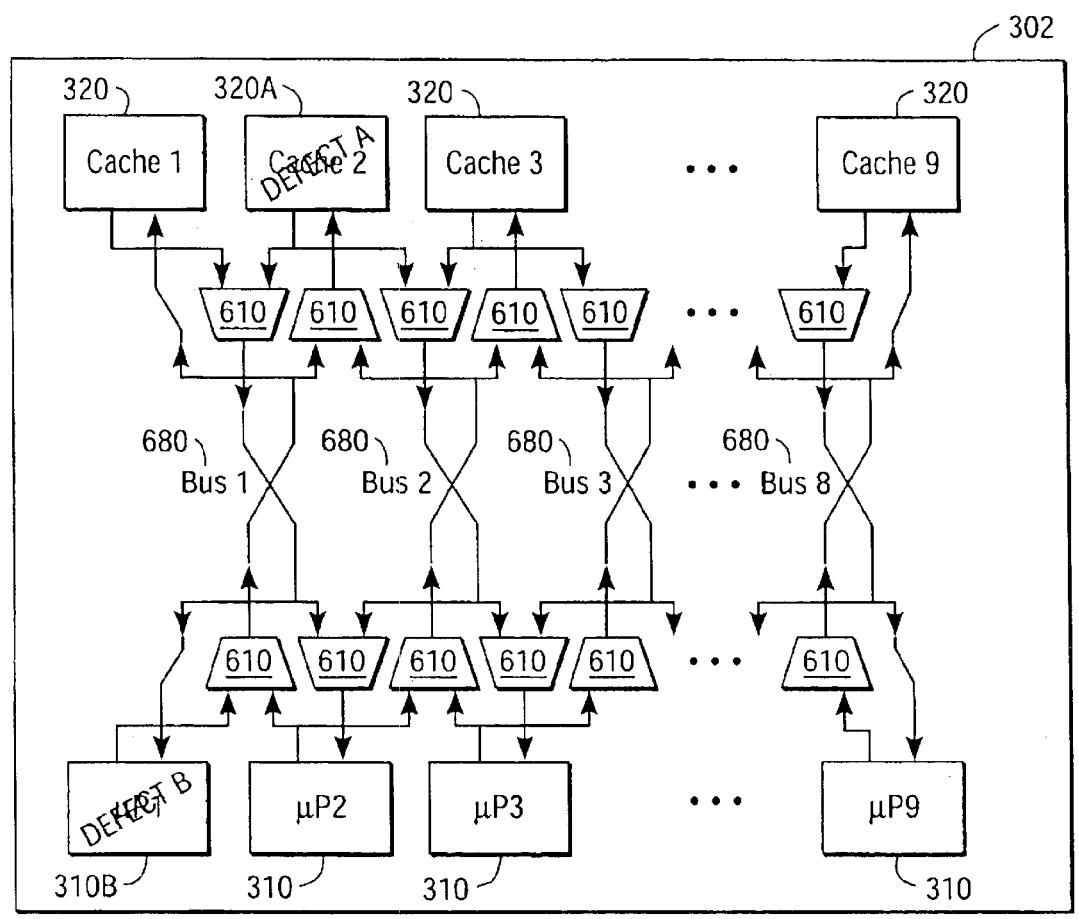
FIG. 6 is a circuit diagram of a first preferred implementation of the multiprocessor of FIG. 5A.

FIG. 6 shows a first implementation of a programmable signal bus 595 having a programmable selector circuit 590 that includes a plurality of multiplexors 610 and bus links 680 arranged to permit the multiplexors 610 to be programmed to link one cache memory element 320 to one microprocessor 310 via a selected signal bus link 580. Preferred techniques to program the multiplexors include coupling the signal select lines (not shown) of each multiplexor 610 to fuses, anti-fuses, scan string latches, or other programmable memory elements. The redundant architecture shown in FIG. 6 permits the programmable signal bus 595 to route around a defective cache memory element 320A or a defective microprocessor 320B. It will be understood, however, that the redundant architecture may be extended to include two or more redundant microprocessors or two or more redundant cache memory elements.

Figure 7:
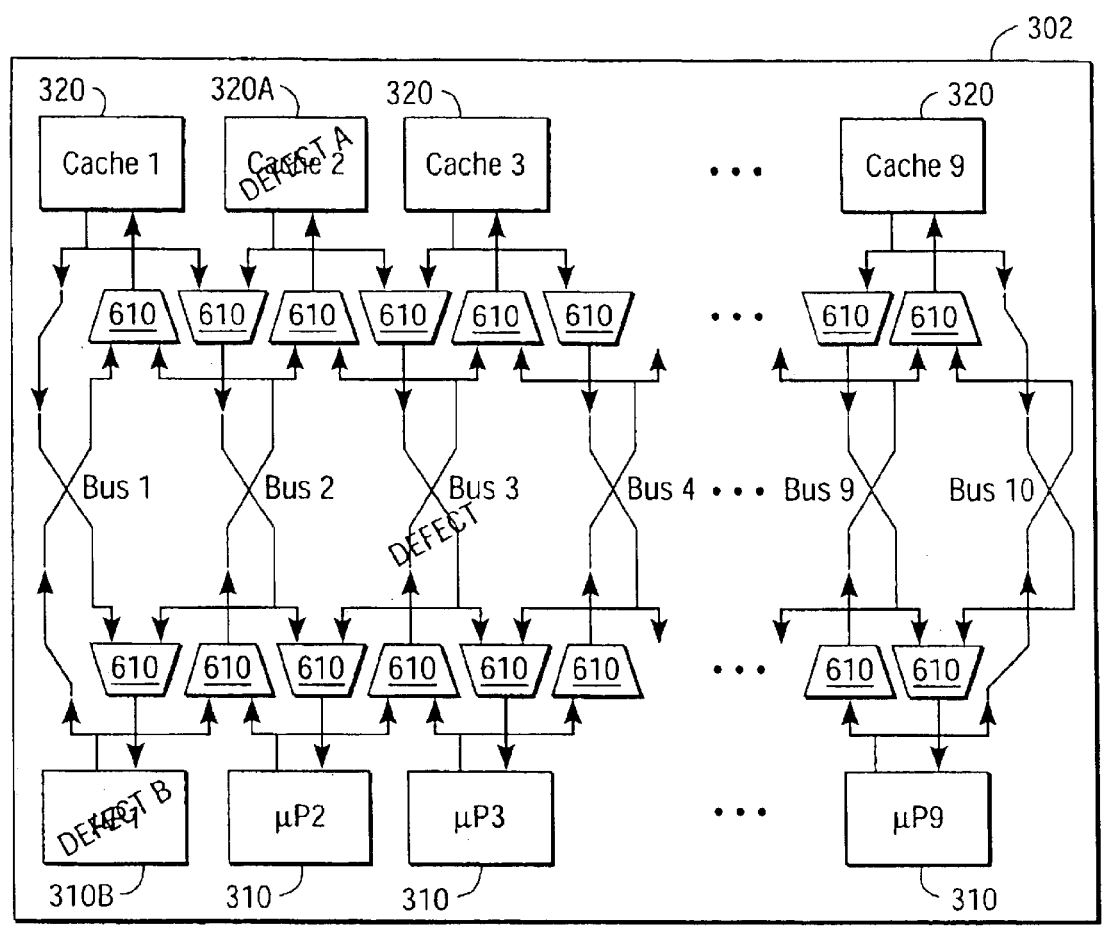
FIG. 7 is a circuit diagram of a second preferred implementation of the multiprocessor of FIG. 5B.

Additionally, as shown in FIG. 7, redundant bus links may also be included to permit defects in the bus wiring to be routed around. For example if bus 3 in FIG. 7 is defective, the multiplexor circuit comprised of the multiplexors 610 and bus links Bus1, Bus2, . . . Bus10 can be programmed to bypass a defective microprocessor, such as microprocessor 310B, a defective cache, such as cache 320A, and a defective bus link, such as bus 3. It will be understood that programmable signal bus 595 may also be implemented with other multiplexor circuit implementations, including tri-state and dynamic buses.

It will be understood that the redundant architecture may be practiced with any chip having one or more active microprocessors 310 coupled by a signal bus to on-chip cache memories 320, such as a multiprocessor chip with two active parallel microprocessors and one redundant microprocessor. The redundant architecture shown in FIGS. 5–7 provides the greatest cost benefit for chips that have a large area devoted to on-chip cache memory and a large number of microprocessors because the incremental die area to add a redundant microprocessor is small. For example, a multiprocessor that is ½ L2 cache (by area) and which has eight microprocessors operated as a parallel processor requires an incremental die area for a single redundant microprocessor of only 6%, which is small compared to the improvements in effective microprocessor yield and chip productivity provided by the redundant microprocessor. However, substantial cost benefits are also achieved for multiprocessor chips having only one active microprocessor because of the area associated with L2 cache. For example, adding one additional microprocessor is less than 25% of the total chip area when ½ of the chip is L2 cache. The incremental cost of adding an additional microprocessor is small compared to the cost benefits of adding an additional microprocessor.

The redundant architecture of multiprocessor 500 provides dramatic improvements in chip yield with only a modest increase in chip area. The yield of a single component having a critical device area can be estimated by the equation $Yc=\exp(-(D \times Ac))$, where Yc is the yield of the critical area, D is the defect rate, and Ac is the critical area. For the case of redundancy the chip yield can be calculated using the techniques of combinatorial probability. As an illustrative example, consider a multiprocessor having nine microprocessors with one redundant microprocessor, i.e., a multiprocessor chip requiring 8 active microprocessors. The total microprocessor yield is $Ypr=(Yp)^9+9(Yp)^8(1-Yp)$ where Ypr is the yield with redundancy and Yp is the yield of an individual microprocessor. Table 1 is a table showing a comparison of the expected yield of a multiprocessor 300 having a total of eight microprocessors assuming several different defect rates. Table 2 is a table showing a multiprocessor 500 having a total of 9 microprocessors fabricated on the chip with one of the microprocessors reserved as a redundant component. The area occupied by each cache memory and each microprocessor is assumed to be the same as in Table 1. The use of a redundant architecture provides a dramatic improvement in chip yield, nearly tripling chip yield for the case of defect densities of 2 defects per square centimeter.

TABLE 1

Estimated Yield For A Multiprocessor Without Redundancy

| | Defect rates (defects/cm²) | | | |
|---|---|---|---|---|
| | 0.25 | 0.50 | 1.0 | 2.0 |
| Cache @ 180 mm² | 90% | 90% | 90% | 90% |
| 8 microprocessors at 160 mm² | 67% | 45% | 20% | 4% |
| Prior art chip at 340 mm² | 60% | 40% | 18% | 4% |

TABLE 2

Estimated Yield For A Multiprocessor Having Redundant Micro processors.

| | Defect rates (defects/cm²) | | | |
|---|---|---|---|---|
| | 0.25 | 0.5 | 1.0 | 2.0 |
| Cache @ 180 mm² | 90% | 90% | 90% | 90% |
| 1 microprocessor @ 20 mm² | 95% | 90% | 82% | 67% |
| 8 of 9 microprocessors @ 180 mm² | 93% | 79% | 49% | 15% |
| Chip yield for 360 mm² | 84% | 71% | 45% | 13% |
| Chip yield normalized to account for fewer chips/wafer | 79% | 67% | 42% | 13% |

Figure 8:
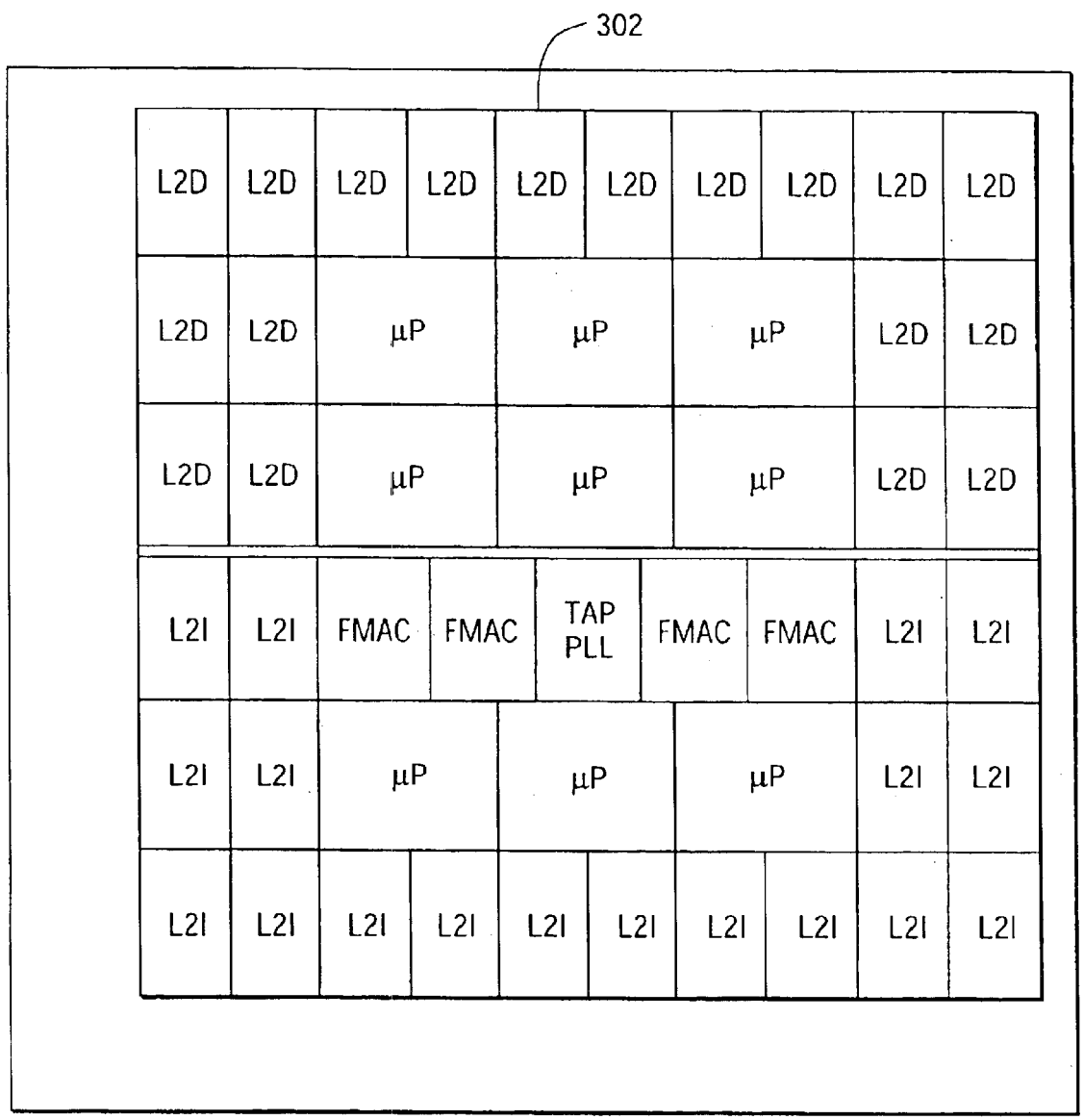
FIG. 8 is a floorplan of a preferred multiprocessor layout showing relative areas and locations of major components.

FIG. 8 is a preferred floorplan of a multiprocessor chip showing relative areas of blocks of microprocessors and L2 cache memories. Each L2 cache memory is divided into data and instruction elements. The floor plan includes other conventional elements, such as floating Point Macro (FMAC), a test auxiliary processor (TAP) used to test, bring up and debug logic, and a phase lock loop (PLL) high frequency clock. The FMAC, TAP, and PLL are also preferably implemented with redundant backup elements. Efficient wire allocations in the multiprocessor are a tradeoff between latency, bandwidth, and the interconnect wire requirements of each block. A preferred multi-level interconnect signal bus has three physical levels of interconnect wires, i.e., a lowermost level, a middle level, and a topmost level of wiring. The topmost level of interconnect wires has a larger spacing between wires and the highest bandwidth per wire. The lowermost level (closest to the substrate) is more densely packed but has a lower bandwidth per wire. The interconnect wire requirements for a block can be estimated by one of ordinary skill in the art by using Rent's law. The largest area blocks are preferably coupled by the topmost level of interconnect wires whereas the smaller blocks are preferably coupled by the lowermost level of interconnect wires.

Figure 9:
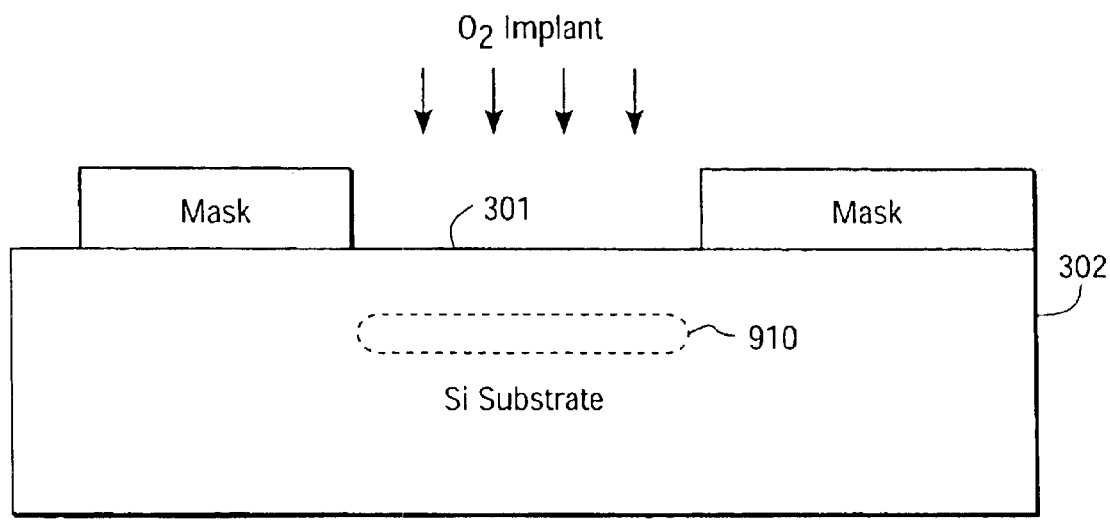
FIG. 9 is a side view of a substrate showing a masked implantation step to form buried oxide layers in selected regions of the substrate.
Figure 10:
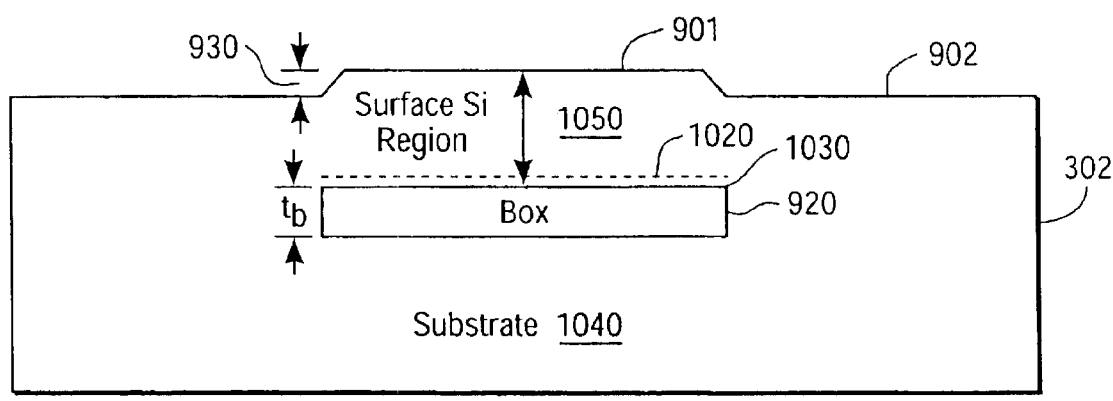
FIG. 10 is a side view of the substrate of FIG. 9 illustrating the resultant step height increase in implanted regions after annealing.

A preferred process for fabricating multiprocessors 300 and 500 includes selectively implanting oxygen in SOI regions in order to form buried oxide (BOX) layers using a variation of the Separation by the IMplantation of OXygen (SIMOX) process. A conventional SIMOX process typically implants an entire wafer with oxygen to form a BOX layer across an entire wafer. In the present invention a patterned mask is used to form masked regions. The mask may be formed from any suitable masking material that blocks oxygen ions and which is compatible with subsequent processing steps. As indicated in FIG. 9, in the present invention patterned regions of substrate 302 are selectively implanted with oxygen ions to form an implanted layer 910 of oxygen ions implanted below the surface 301 of the chip in selected regions. As shown in FIG. 10, a subsequent annealing step converts the implanted regions into silicon dioxide BOX layer 920. Silicon dioxide occupies 2.2 times the volume of crystalline silicon for each volume of silicon. Consequently, as shown in FIG. 10, the annealing procedure results in a step 930 increase in surface height of the implanted region 920 due to the volume expansion of the implanted silicon region.

In a preferred embodiment, the oxygen implant has a dose in the range of about $10^{16}$–$10^{17}$ per centimeter square implanted at an energy in the range of 80–120 keV. This corresponds to a BOX layer with a thickness, $t_b$, of 100 nanometers to 400 nanometers disposed a depth, d, about 100 to 200 nanometers below a surface 901 of epitaxial layer of silicon. The post-anneal step height for these choices of parameters is in the range of about 25–100 nanometers.

The step 930 increase in surface height results in two different surface planes 901, 902 subsequent to the annealing step, which may create lithographic problems, particularly if the step 930 is greater than the depth of focus of the subsequent lithographic step. There are several techniques that can be used alone or in combination to minimize the effect that the increase in surface height of the SOI regions has on subsequent process steps. One approach is to adjust the implantation parameters to reduce the increase in surface height of SOI regions. The implantation dose and energy may be selected to minimize the total thickness of the BOX layer to a thickness less than 200 nanometers, with a preferred thickness range being 100–200 nanometers, to have a corresponding step 930 of between 25 to 50 nanometers. However, for a BOX layer thickness, $t_b$, of less than 200 nanometers the parasitic backgate conduction can be undesirably high using a conventional SOI structure. The backgate conduction is modeled as a parasitic FET conduction associated with an equivalent FET that forms just above the BOX layer 920 with the underlying substrate 1040 functioning as a gate electrode, the BOX layer 920 functioning like a gate oxide, and surface Si region 1050 (with a thickness "d" above the BOX layer 920) functioning as the channel for the parasitic FET. In a preferred embodiment, the parasitic backgate conduction associated with a comparatively thin BOX layer 920 is suppressed by implanting a layer 1020 of ions proximate the surface Si/BOX interface 1030, with the implanted ions having a polarity and charge density selected to suppress backgate conduction at the substrate-BOX interface. This is shown in FIG. 10 as an implanted layer 1020 which the inventors describe as a "backgate suppression implant layer" 1020 (shown in phantom in FIG. 10). Backgate suppression implant layer 1020 is preferably implanted as close as possible to the interface 1030 of the surface Si 1050 and the BOX layer 920. For NMOS transistor devices a boron implant with a dose of $1-2\times10^{13}$ at an energy of 50–80 keV is a preferred backgate suppression implant layer 1020. For PMOS devices a phosphorous implant at a dose of $1-2\times10^{13}$ at an energy of 100–150 keV is a preferred backgate suppression implant layer 1020.

The step 930 in surface height of the SOI regions can also be addressed by using a process having separate lithographic exposures to form critical regions on the SOI and bulk regions, i.e., multiple steps of lithography in which only one of the image planes 901, 902 is patterned at a time. Additionally chemical mechanical polishing (CMP) or other conventional planarization techniques can be used to planarize the surface. Chemical mechanical polishing techniques permit the surface of a semiconductor wafer to be planarized with extremely little damage to underlying layers. If a CMP step is used it is preferably a CMP step performed before critical gate oxide and gate conductor layers are formed so that these steps can be performed on a flat surface. Alternately, after gate oxide is grown and polysilicon is deposited the polysilicon could be planarized via CMP. This would facilitate the lithography of all subsequent processing steps.

The high memory bandwidth afforded by the present invention permits a high performance multiprocessor chip to be implemented despite some degradation in the speed of the microprocessor compared to conventional microprocessor chips, i.e., memory bandwidth can be traded off for microprocessor speed. For example, a 20–30% reduction in microprocessor speed caused by the DRAM process steps is acceptable in the present invention because of the large increase in memory bandwidth afforded by placing large capacity L2 cache memories on the same chip as the microprocessors. Nevertheless, for the best system performance the DRAM cache memory regions are preferably fabricated using a process that does not substantially degrade the performance of the transistors in the microprocessor SOI regions. The microprocessor regions of the chip have a thermal budget associated with deleterious diffusion. Consequently, the process flows are preferably arranged so that the hottest thermal diffusion steps occur earliest in the process (relative to critical microprocessor dopant diffusion steps) to minimize degradation of the microprocessor transistors during the DRAM fabrication process.

A preferred DRAM fabrication process is an embedded DRAM process having a minimal number of high temperature heat cycles that could deleteriously affect the microprocessor transistors. One advantage of an embedded DRAM process is that the process flows may be arranged to improve planarity, i.e., the embedded DRAM can be fabricated down in the silicon substrate with polysilicon and metal layers at about the same height as those for the transistors and metal layers in the microprocessor regions. One example of a suitable embedded DRAM process is the so-called "trench DRAM," structure. The trench DRAM structure uses a buried-strap trench capacitor and bordered bit-line contact that does not require the additional high temperature heat cycles of conventional DRAM transistors having a multiple layer polysilicon capacitor structure. A preferred trench DRAM process is one similar to that developed by International Business Machines (IBM) of Fishkill, N.Y. as described in the paper by S. Crowder, R. Hannon, H. Ho, D. Sinitsky, S. Wu, K. Winstel, B. Khan, S. R. Stiffler, and S. S. Iyer, "An Embedded DRAM High Performance 0.18 $\mu$m Logic Technology with Copper BEOL," International Electron Devices Meeting, San Francisco, Calif. Dec. 6–9 1998, IEDM Technical Digest, IEEE (1998).

In the present invention the microprocessors 310 and DRAM cache memories 320 are preferably implemented using process steps and a circuit layout that minimizes the area of each major element in order to permit a large number (e.g., nine) of processors to be included in a conventional die size. Reductions in transistor gate length are associated with reductions in transistor area according to well known scaling laws. A preferred lithographic process is to use deep ultraviolet (DUV) lithography to fabricate critical transistor gate dimensions. DUV lithography techniques permit gate lengths of 100 nanometers or less to be fabricated. An example of a DUV light source is an excimer laser with a wavelength of 248 or 193 nanometers. DUV lithography with phase shift masks (PSMs) is preferably used to facilitate control of feature linewidth. PSMs advantageously create constructive and destructive interference to cancel out some of the spreading effects caused by light diffraction. PSMs typically include a base material and a patterned shifter layer with increased optical thickness. In one implementation the phase shifter regions retard passing light at an extra ¾ of a wavelength than the base region while thin coated regions retard light at ¼ of a wavelength. When a strip of ¾ wavelength material is laid adjacent to a ¼ wavelength, a ½ wavelength difference generates an interference pattern that prints an image on a mask. Smaller shifts are below the exposure limit and do not print an image.

While the present invention has been described in detail in regards to a high performance multiprocessor chip, it will be understood by those in the art that embodiments of the present invention may be applied to a variety of circuits in which high-density memory is combined with logic processing in a single integrated circuit chip, particularly circuits in which bulk and SOI circuits are combined on the same die. For example, many digital signal processors, mixed digital/analog chips, graphics processors, disk controllers, multimedia controllers, moving picture expert group (MPEG) encoders, and video tape recorders have circuits that include at least one microprocessor and dense memory. In accord with the teachings of the present invention, a programmable signal bus may be used to integrate the microprocessors of a variety of different types of circuits with at least one redundant microprocessor or memory included to improve chip yield. Additionally, in accord with the teachings of the present invention, a wide variety of different types of circuits may be fabricated having high performance microprocessors fabricated on SOI and DRAM memory fabricated on bulk silicon.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. An integrated circuit chip with redundant elements, comprising:
   a substrate die;
   a plurality of microprocessors disposed in said substrate die, each microprocessor having a data interface;
   a plurality of cache memories disposed in said substrate die, each cache memory having at least one memory interface for accessing the cache memory; and
   a signal bus disposed in said substrate die, said signal bus including a programmable selector circuit for selecting a subset of said plurality of microprocessors to be used for processing information and for selecting a subset of said plurality of cache memories, said selector circuit simultaneously linking the data interface of a first selected microprocessor to a memory interface of a first selected cache memory and linking the data interface of a second selected microprocessor to a memory interface of a second selected cache memory.

2. The integrated circuit chip of claim 1, wherein the substrate die comprises a conductive silicon substrate having at least one bulk region and at least one silicon-on-insulator region, the cache memories being dynamic random access memories residing on said at least one bulk region and the microprocessors residing on said at least one silicon-on-insulator region.

3. The integrated circuit chip of claim 1, wherein said signal bus is a broadband signal bus.

4. The integrated circuit chip of claim 1, wherein said signal bus further comprises at least one active element to regenerate a data signal coupled by the signal bus between the first selected microprocessor and the first selected cache memory.

5. The integrated circuit chip of claim 1, wherein the chip is a multiprocessor and there are a total of N microprocessors and a subset of N−1 microprocessors is selected for parallel processing by the selector circuit.

6. The integrated circuit chip of claim 5, wherein there are a total of N cache memories and said selector circuit selects subset of N−1 cache memories for parallel processing.

7. The integrated circuit chip of claim 5, wherein said cache memories are level-2 cache memory units.

8. The integrated circuit chip of claim 7, wherein one of said cache memories comprises a cache sized to provide the cache resources of a level-2 cache memory and a level-3 cache memory.

9. The integrated circuit chip of claim 1, wherein the chip is a multiprocessor and the signal bus couples the microprocessors as a parallel processor.

10. The integrated circuit chip of claim 9, wherein said plurality of microprocessors includes at least nine microprocessors.

11. The integrated circuit chip of claim 1 wherein said programmable selector circuit is a multiplexor circuit.

12. The integrated circuit chip of claim 1, wherein said cache memories include level-2 cache memories and level-3 cache memories and one microprocessor is coupled to one level-2 cache memory and to one level-3 cache memory by the signal bus.

13. A multiprocessor chip, comprising:
    a silicon substrate die having at least one bulk region and at least one silicon-on-insulator region, the silicon-on-insulator region including a buried oxide layer residing a preselected distance between an outer surface layer of crystalline silicon;
    a plurality of microprocessors, each said microprocessor formed in said at least one silicon-on-insulator region, each microprocessor having a data interface;
    a plurality of dynamic random access memory (DRAM) cache memories formed in said at least one bulk region, each cache memory having a memory interface for accessing the cache memory; and
    a high bandwidth signal bus formed on said substrate having interconnect wires for linking the data interface of one microprocessor to a corresponding memory interface of one of the cache memories as a parallel processor.

14. The multiprocessor of claim 13, wherein said signal bus includes a programmable selector circuit for selecting a subset of the components that are utilized by the parallel processor, whereby a defective component may be bypassed, the selected components being chosen from a group consisting of microprocessors, cache memories, and the interconnect wires of the signal bus.

15. The multiprocessor of claim 13, wherein said cache memories are comprised of trench DRAM memories.

16. The multiprocessor of claim 15, wherein said buried oxide layer has a thickness of less than 200 nanometers.

17. The multiprocessor of claim 16, further comprising a layer of ions disposed proximate the interface of the buried oxide layer and the surface layer of crystalline silicon, said ions having a polarity and dose selected to suppress back-gate conduction.

18. The multiprocessor of claim 13, wherein said signal bus includes at least one active element to regenerate a signal coupled between a microprocessor and a cache memory.

19. The multiprocessor of claim 13, wherein one of the cache memories is a level-2 cache memory.

20. The multiprocessor of claim 13, wherein one of the cache memories has a data capacity sufficient to provide the function of a level-2 cache memory and a level-3 cache memory.

21. The multiprocessor of claim 13, wherein the cache memories comprise level-2 cache memories and level-3 cache memories.

22. A multiprocessor chip, comprising:
    a silicon substrate die having at least one bulk region and at least one silicon-on-insulator region, the silicon-on-insulator region including a buried oxide layer residing a preselected distance below an outer surface layer of crystalline silicon;
    a plurality of microprocessors, each said microprocessor formed in said at least one silicon-on-insulator region, each microprocessor having a data interface;
    a plurality of dynamic random access memory (DRAM) level-2 cache memories formed in said at least one bulk region, each level-2 cache memory having a memory interface for accessing the memory; and
    a high bandwidth signal bus formed on said substrate die having interconnect wires for linking the data interface of one microprocessor to a corresponding memory interface of one of the level-2 cache memories as a parallel processor, said signal bus including a programmable selector circuit for selecting a subset of said plurality of microprocessors and for selecting a subset of said cache memories to be used for parallel processing, said selector circuit simultaneously linking the data interface of a first selected microprocessor to the memory interface of a first selected cache memory and linking the data interface of a second selected microprocessor to the memory interface of a second selected cache memory, whereby a defective microprocessor or a defective cache memory may be bypassed.

23. The multiprocessor chip of claim 22, wherein the level-2 cache memories are sized to provide the function of off-chip level-2 cache memories and off-chip level-3 cache memories.

24. The multiprocessor chip of claim 22, further comprising:

a second plurality of dynamic random access memory (DRAM) cache memories formed in said at least one bulk region, each cache memory of the second plurality of cache memories sized to provide the function of a level-3 cache memory and having a memory interface for accessing the memory, wherein said second plurality of cache memories is simultaneously coupled by said signal bus to the plurality of microprocessors with a first selected microprocessor linked to a first selected one of the second plurality of cache memories and with a second selected microprocessor linked to a second selected one of the second plurality of cache memories.

* * * * *